United States Patent
Chen et al.

(10) Patent No.: US 8,581,655 B2
(45) Date of Patent: Nov. 12, 2013

(54) CLOCK SIGNAL SUPPLYING METHOD AND CIRCUIT FOR SHIFT REGISTERS

(75) Inventors: Yung-Chih Chen, Hsin-Chu (TW); Kuo-Chang Su, Hsin-Chu (TW); Chun-Huan Chang, Hsin-Chu (TW); Yu-Chung Yang, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 100 days.

(21) Appl. No.: 13/270,382

(22) Filed: Oct. 11, 2011

(65) Prior Publication Data

US 2012/0161842 A1    Jun. 28, 2012

(30) Foreign Application Priority Data

Dec. 23, 2010  (TW) ................ 99145596 A

(51) Int. Cl.
*G06F 1/04* (2006.01)

(52) U.S. Cl.
USPC ............ 327/299; 327/355; 327/357; 455/323

(58) Field of Classification Search
USPC ................................................ 327/365–508
See application file for complete search history.

(56) References Cited

U.S. PATENT DOCUMENTS

| | | | | |
|---|---|---|---|---|
| 4,813,041 A * | 3/1989 | Reyneri | ......................... | 370/532 |
| 6,018,559 A * | 1/2000 | Azegami et al. | ................ | 377/79 |
| 6,794,916 B1 * | 9/2004 | Varma | ......................... | 327/218 |
| 6,829,750 B2 * | 12/2004 | Maki et al. | .................... | 326/113 |
| 6,950,609 B2 * | 9/2005 | Marom | .......................... | 398/83 |
| 6,970,115 B1 * | 11/2005 | Sardi et al. | .................... | 341/100 |
| 7,084,666 B2 * | 8/2006 | Madurawe | ...................... | 326/38 |
| 7,259,589 B1 * | 8/2007 | Hui et al. | ........................ | 326/63 |
| 8,035,435 B1 * | 10/2011 | Shringarpure et al. | ....... | 327/167 |
| 8,093,922 B2 * | 1/2012 | Teig et al. | ........................ | 326/38 |
| 8,159,266 B1 * | 4/2012 | Madurawe | ...................... | 326/41 |
| 2002/0140491 A1 * | 10/2002 | Shim | ............................. | 327/355 |
| 2003/0038665 A1 * | 2/2003 | Naven | ........................... | 327/298 |
| 2003/0214335 A1 * | 11/2003 | Saeki | ............................. | 327/165 |
| 2004/0004498 A1 * | 1/2004 | Nakao | ............................ | 326/95 |
| 2004/0127187 A1 * | 7/2004 | Peterson et al. | .............. | 455/323 |
| 2004/0239603 A1 | 12/2004 | Toriumi et al. | | |
| 2005/0017781 A1 * | 1/2005 | Honda | .......................... | 327/295 |
| 2007/0200595 A1 | 8/2007 | Kao | | |
| 2008/0111801 A1 | 5/2008 | Hsu | | |
| 2008/0242252 A1 * | 10/2008 | Youssoufian | ................. | 455/307 |
| 2008/0284487 A1 * | 11/2008 | Pullela et al. | ................. | 327/355 |
| 2009/0036069 A1 * | 2/2009 | Seckin et al. | ................ | 455/118 |
| 2009/0174459 A1 * | 7/2009 | Cicalini | ........................ | 327/356 |
| 2011/0122123 A1 | 5/2011 | Hsu | | |
| 2011/0199142 A1 * | 8/2011 | Mu | ............................... | 327/299 |
| 2011/0316603 A1 * | 12/2011 | Murata et al. | ................. | 327/175 |
| 2012/0049928 A1 * | 3/2012 | Cicalini | ........................ | 327/355 |

FOREIGN PATENT DOCUMENTS

| | | |
|---|---|---|
| CN | 1530907 | 9/2004 |
| CN | 101592975 | 12/2009 |

* cited by examiner

*Primary Examiner* — Lincoln Donovan
*Assistant Examiner* — Brandon S Cole
(74) *Attorney, Agent, or Firm* — WAPT, PC; Justin King

(57) ABSTRACT

A clock signal supplying method for shift registers includes following steps: receiving a clock signal; and transmitting the clock signal to two first stage signal transmission paths simultaneously, the first stage signal transmission paths determined by a first control signal whether to be conducted, and further conducted at different time.

9 Claims, 6 Drawing Sheets

CLOCK SIGNAL SUPPLYING METHOD AND CIRCUIT FOR SHIFT REGISTERS

TECHNICAL FIELD

The present disclosure relates to methods and circuits for shift registers, and more particularly to a clock signal supplying method and a circuit for shift registers.

BACKGROUND

Currently, a shift register circuit of a flat-panel liquid-crystal display is formed on a glass substrate by one of a-Si and p-Si manufacture procedures. The two manufacture procedures get low cost for gates driving circuit, simplify process of producing modules, increase utilization of the glass substrate, etc. Take the most common shift register circuit for an example, it usually includes cascading shift registers. The shift registers receive high-frequency clock signals, and orderly activate corresponding gates and pixels, which couple with the shift registers, to display information.

However, when the shift register of the flat-panel liquid-crystal display is formed on the glass substrate and high-frequency clock signals are applied therein, great parasitic capacitance may be affected the operation speed and dynamic power dissipation is increased.

SUMMARY

Therefore, one of the object of the disclosure is to provide a clock signal supplying method for shift registers, which obtains a highly reduction on corresponding dynamic power consumption.

The another object of the disclosure provides a clock signal supplying circuits of shift registers, which applies the above clock signal supplying method to obtain a highly reduction on corresponding dynamic power consumption.

The disclosure provides a clock signal supplying method for shift registers, which includes following steps: receiving a clock signal; and transmitting the clock signal to two first stage signal transmission paths simultaneously, the first stage signal transmission paths determined by a first control signal whether to be conducted, and further conducted at different time.

In the clock signal supplying method of the disclosure, when the first stage signal transmission paths are determined by the first control signal whether to be conducted, the first control signal comprises two contrary control signals.

In the clock signal supplying method of the disclosure, each first stage signal transmission path is diverged into two second stage signal transmission paths, the second stage signal transmission paths are determined by a second control signals whether to be conducted, and are conducted at different time.

In the clock signal supplying method of the disclosure, when the second stage signal transmission paths are determined by the second control signal whether to be conducted, the second control signal comprises two contrary control signals.

In the clock signal supplying method of the disclosure, signals from the second stage signal transmission paths, which the second stage signal transmission paths are diverged from the same first stage signal transmission path, are applied on different shift registers.

In the clock signal supplying method of the disclosure, signals from the different first stage signal transmission paths are applied on different shift registers.

The disclosure also provides a clock signal supplying circuit for shift registers, which includes a signal source for receiving a clock signal, a first signal transmission line, a second signal transmission line, a first switch electrically coupled between the signal source and the first signal transmission line, and a second switch, electrically coupled between the signal source and the second signal transmission line. A first control signal is configured for controlling the first switch and the second switch whether to be turned on, and the first switch and the second switch are turned on at different time.

In the clock signal supplying circuit of the disclosure, further includes a third signal transmission line, a fourth signal transmission line, a third switch electrically coupled between the first signal transmission line and the third signal transmission line, and a fourth switch electrically coupled between the first signal transmission line and the fourth signal transmission line. A second control signal is configured for controlling the third switch and the fourth switch whether to be turned on, and the third switch and the fourth switch are turned on different time.

In the clock signal supplying circuit of the disclosure, one of the third switch and the fourth switch is an N type transistor, and the other one of the third switch and the fourth switch is a P type transistor.

In the clock signal supplying circuit of the disclosure, one of the first switch and the second switch is an N type transistor, and the other one of the first switch and the second switch is a P type transistor.

Solution of the disclosure, for solving the above problem, is that apply the above clock signal supplying method in the above clock signal supplying circuit. Therefore, after the clock signal supplying circuit of the disclosure receives frequency clock signal, the frequency clock signal is transmitted to multi-stage signal transmission paths, and is redistributed at different time to generate a redistributed clock signal. The redistributed clock signal is applied on different shift registers. Therefore, times for shifting the original clock signal are decreased, and power consumption of the whole circuit gets low cost.

BRIEF DESCRIPTION OF THE DRAWINGS

The above objects and advantages of the disclosure will become more readily apparent to those ordinarily skilled in the art after reviewing the following detailed description and accompanying drawings, in which.

DETAILED DESCRIPTION OF PREFERRED EMBODIMENTS

The disclosure will now be described more specifically with reference to the following embodiments. It is to be noted that the following descriptions of preferred embodiments are presented herein for purpose of illustration and description only. It is not intended to be exhaustive or to be limited to the precise form disclosed.

First Embodiment

Figure 1:
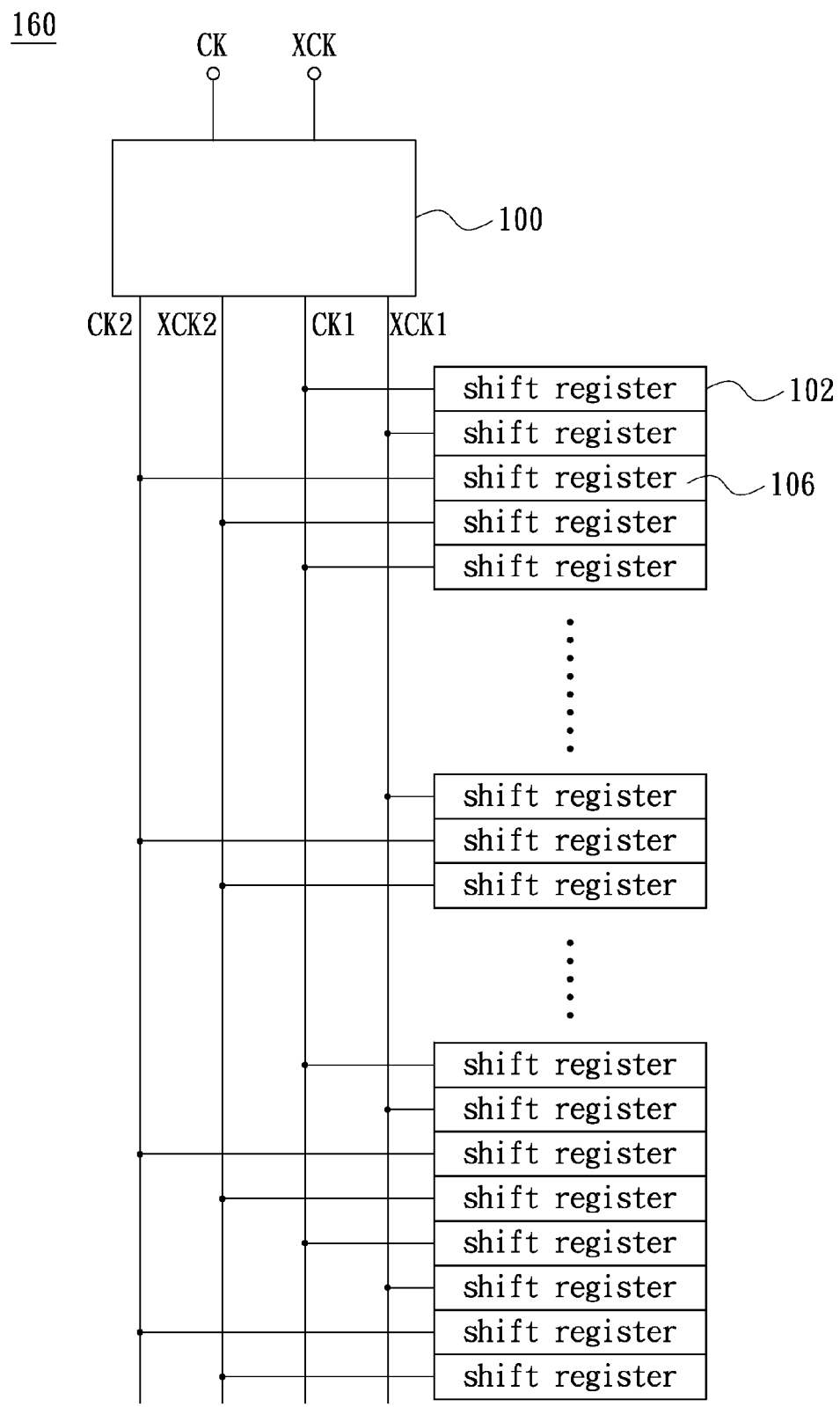
FIG. 1 is a partial schematic diagram of a shift register circuit having a clock signal supplying circuit, according to an embodiment.

Referring to FIG. 1, a shift register module 160 is partially shown as an embodiment. The shift register module 160 includes a clock signal supplying circuit 100 and some cascading shift registers, labeled as 102, 106, etc. The clock signal supplying circuit 100 receives high-frequency clock signals, such as CK and XCK, by wires. The low-frequency clock signals, such as CK1, CK2, XCK1, and XCK2, are generated at different time accordingly by the clock signal supplying circuit 100. That is to say, the high-frequency clock signal CK is converted to two low-frequency clock signals CK1 and CK2 by the clock signal supplying circuit 100. The two low-frequency clock signals CK1 and CK2 are transmitted to shift registers 102 and 106, and are used for driving each shift register to run sequentially at different time.

Figure 2:
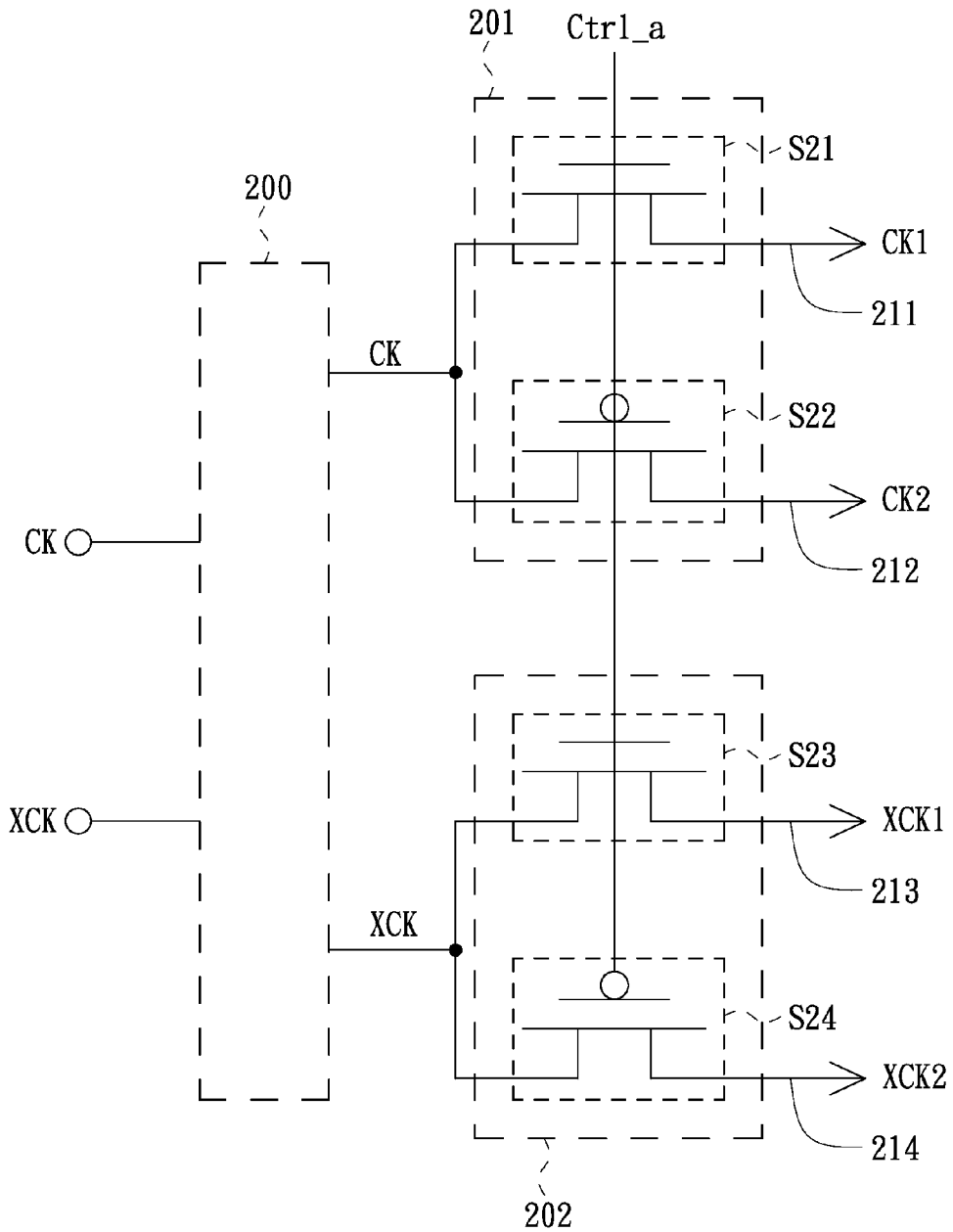
FIG. 2 is a schematic diagram of the clock signal supplying circuit of FIG. 1.

Further referring to FIG. 2, the clock signal supplying circuit 100 is shown according to the present embodiment. The clock signal supplying circuit 100 includes a signal source 200, four signal transmission lines 211, 212, 213, and 214, and four switches S21, S22, S23, and S24. The signal source 200 is able to receive at least one of the two high-frequency clock signals CK and XCK, and transmits to other following members accordingly. Specifically in this embodiment, the signal source 200 receives the two high-frequency clock signals CK and XCK at the same time. In other embodiments, the signal source 200 may only receive one high-frequency clock signal. The signal source 200 transmits the two high-frequency clock signals CK and XCK to two signal transmission path groups 201 and 202 respectively.

As the two signal transmission path groups 201 and 202 have the same structure, their operations are similar. In order to simplify the description, the signal transmission path group 201 is taken as an example and is described below.

Referring to FIG. 2 again, the signal transmission path group 201 includes two signal transmission lines 211 and 212 (classified as first stage signal transmission path, see below). When the signal transmission path group 201 is determined by a control signal Ctrl_a (also named as first control signal, see below) whether to be conducted, the two signal transmission lines 211 and 212 are determined to be conducted at different time.

When the high-frequency clock signal CK received by the signal source 200 is transmitted to the signal transmission path group 201, the two signal transmission lines 211 and 212 outputs the two low-frequency clock signals CK1 and CK2 after the high-frequency clock signal CK flowing through the two switches S21 and S22. The switch S21 (also named as first switch, see below) is electrically coupled between the signal source 200 and the signal transmission line 211 (also named as first transmission line, see below). The switch S22 (also named as second switch, see below) is electrically coupled between the signal source 200 and the signal transmission line 212 (also named as second transmission line, see below). The control signal Ctrl_a is used for determining whether the two switches S21 and S22 are turned on, and further for turning on the two switches S21 and S22 at different time.

By the way, the signal source 200 can also transmit the high-frequency clock signal XCK to the signal transmission path group 202. Then, the two signal transmission lines 213 and 214 respectively output the two low-frequency clock signals XCK1 and XCK2, which are respectively generated by transmitting the high-frequency clock signal XCK through the two switches S23 and S24. As the signal transmission path group 202 has similar function with the signal transmission path group 201, it is absent here.

According to the present embodiment shown in FIG. 2, the control signal Ctrl_a determines whether the four switches S21, S22, S23, and S24 are turned on, and further controls the switches coupled to the same signal transmission path group to turn on at different time. In this embodiment, the two high-frequency clock signals CK and XCK are inverting with each other. For example, when the high-frequency clock signal CK is enabled (a high level signal), the high-frequency clock signal XCK is disabled (a low level signal); when the high-frequency clock signal XCK is enabled (a high level signal), the high-frequency clock signal CK is disabled (a low level signal). Therefore, when the two high-frequency clock signals CK and XCK are activated on the clock signal supplying circuit 100, the two high-frequency clock signals CK and XCK are able to be redistributed according to ways either shown in FIG. 3A or FIG. 3B.

Figure 3A:
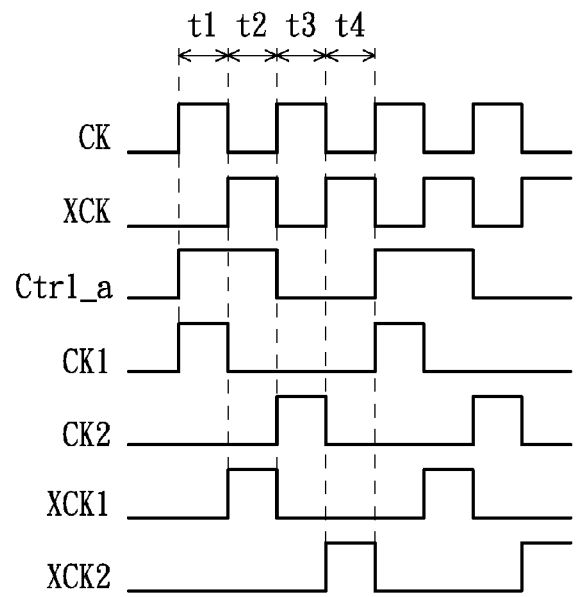
FIG. 3A is a timing diagram of a clock signal supplying method according to an embodiment.
Figure 3B:
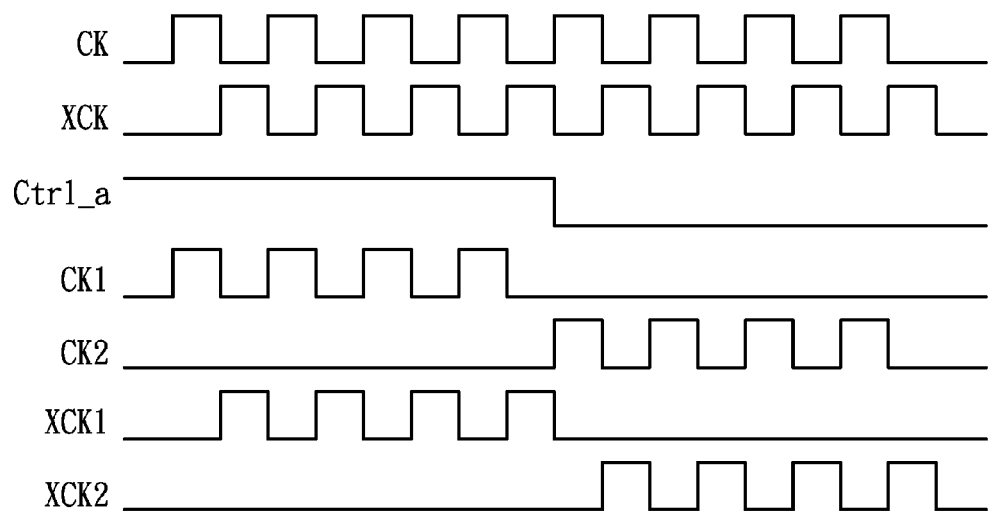
FIG. 3B is a timing diagram of a clock signal supplying method according to another embodiment.

Referring to FIG. 3A and FIG. 3B, timing diagrams of the clock signal supplying method according to an embodiment are shown therein. When the control signal Ctrl_a is a high level signal, the two switches S21 and S23 are turned on. At a first time t1, only the high-frequency clock signal CK is a high level signal, thus, as the corresponding switch S21 is turned on, the high-frequency clock signal CK is transmitted and a pulse of the low-frequency is generated on the signal transmission line 211 accordingly. At a second time t2, only the high-frequency clock signal XCK is a high level signal, thus, as the corresponding switch S23 is turned on, the high-frequency clock signal XCK is transmitted and a pulse of the low-frequency clock signal XCK1 is generated on the signal transmission line 213 accordingly.

In a similar way, when the control signal Ctrl_a is a low level signal, the two switches S22 and S24 are turned on. At a third time t3, only the high-frequency clock signal CK is a high level signal, thus, as the corresponding switch S22 is turned on, the high-frequency clock signal CK is transmitted and a pulse of the low-frequency clock signal CK2 is generated on the signal transmission line 212 accordingly. At a fourth time t4, only the high-frequency clock signal XCK is a high level signal, thus, as the corresponding switch S24 is turned on, the high-frequency clock signal XCK is transmitted and a pulse of the low-frequency clock signal XCK2 is generated on the signal transmission line 214 accordingly.

Referring to FIG. 2 and FIG. 3B, when the control signal Ctrl_a is a high level signal, the two switches S21 and S23 are turned on. When the high-frequency clock signal CK is a high level signal, the high-frequency clock signal CK is transmitted to the signal transmission line 211 by the switch S21, and is converted to the low-frequency clock signal CK1. When the high-frequency clock signal XCK is a high level signal, the high-frequency clock signal XCK is transmitted to the signal transmission line 213 by the switch S23, and is converted to the low-frequency clock signal XCK1.

In a similar way, when the control signal Ctrl_a is a low level signal, the two switches S22 and S24 are turned on. When the high-frequency clock signal CK is a high level signal, the high-frequency clock signal CK is transmitted to the signal transmission line 212 by the switch S22, and is converted to the low-frequency clock signal CK2. When the high-frequency clock signal XCK is a high level signal, the high-frequency clock signal XCK is transmitted to the signal transmission line 214 by the switch S24, and is converted to the low-frequency clock signal XCK2.

Figure 3C:
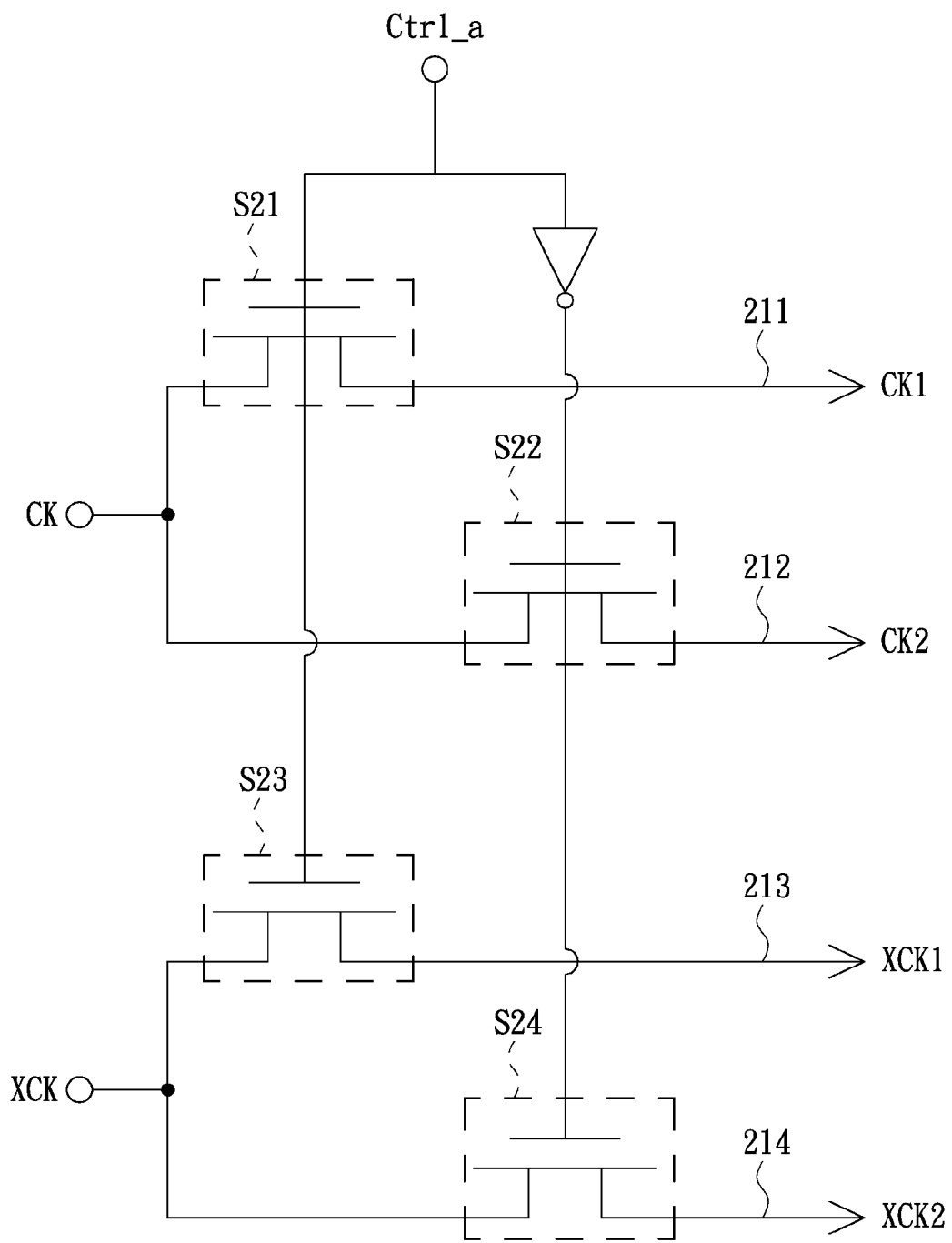
FIG. 3C is similar to FIG. 2, but showing another schematic diagram of the clock signal supplying circuit.

Referring to FIG. 2, FIG. 3A, and FIG. 3B again, when the control signal Ctrl_a is a high level signal, the two switches S21 and S23 are turned on, and the two switches S22 and S24 are turned off. Accordingly, each signal transmission path group may include two transistors as the switches, and one of the two switches can be an N type transistor when another one of the two switches can be a P type transistor. According to the above operation of the clock signal supplying circuit 100, the two switches of the same signal transmission path group are in contrary states while being operated. Therefore, as long as the redistributions of the two high-frequency clock signals CK and XCK is not effected, the control signal Ctrl_a can be activated on other electronic members, such as inverters (see FIG. 3C).

As described above, when the clock signal supplying circuit 100 receives an original clock signal, the original clock signal will be transmitted to multi-stage signal transmission paths, and be redistributed at different time to generate a redistributed clock signal. The redistributed clock signal is applied on different shift registers. Therefore, times for shifting clock signals in the cascading shift registers are decreased, and power consumption of the whole circuit is lower.

Second Embodiment

Figure 4:
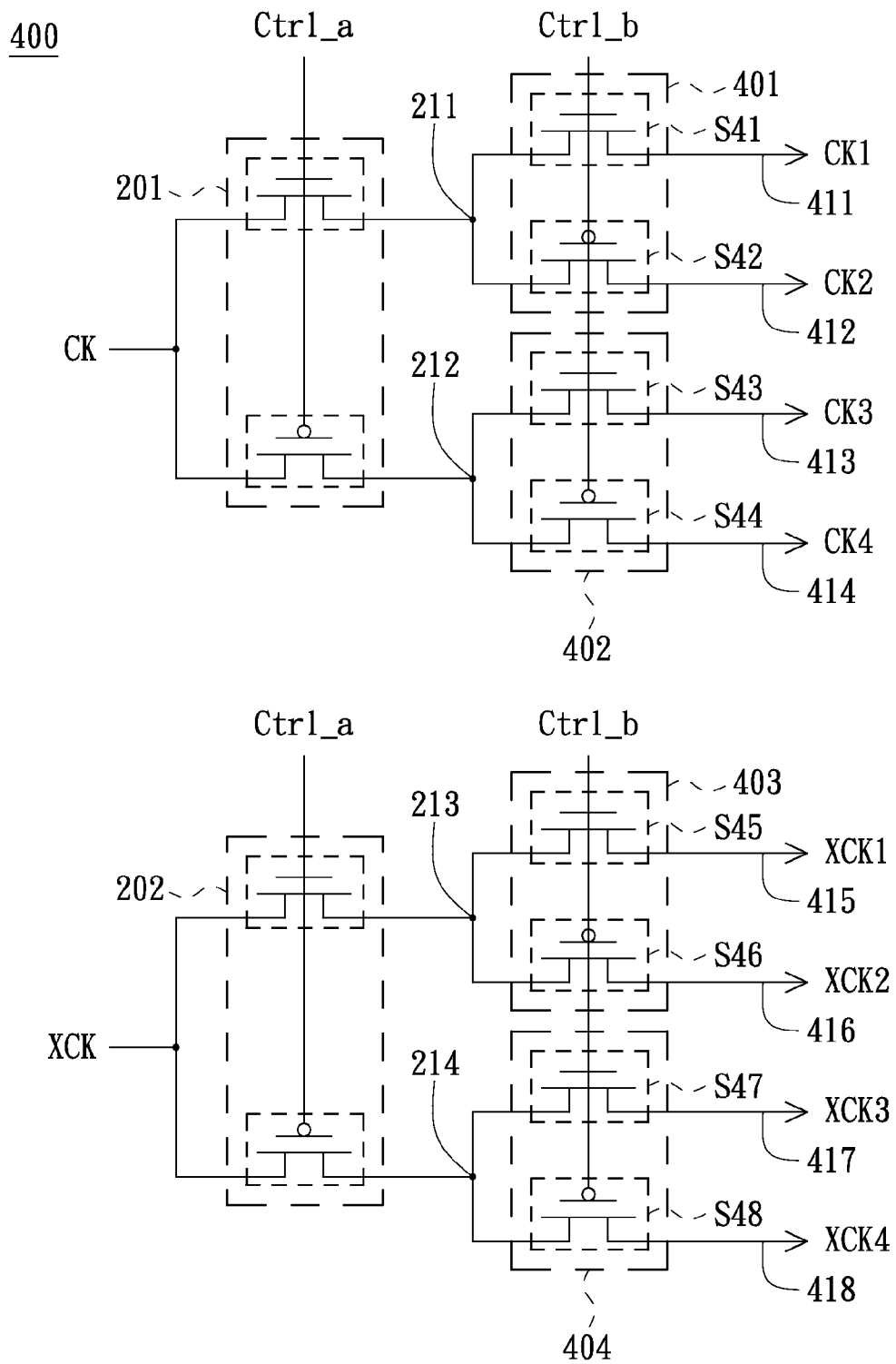
FIG. 4 is a schematic diagram of the clock signal supplying circuit according to another embodiment.

Referring to FIG. 4, another clock signal supplying circuit is shown according to another embodiment. The clock signal supplying circuit shown in FIG. 4 is similar with that in FIG. 2. The difference between the two clock signal supplying circuits is that: the clock signal supplying circuit shown in FIG. 2 only uses the first stage signal transmission path; however, the clock signal supplying circuit shown in FIG. 4 further uses the second stage signal transmission path. Specifically, the clock signal supplying circuit shown in FIG. 4 designs four signal transmission path groups 401, 402, 403, and 404 (the second stage signal transmission path) diverged from the two signal transmission path groups 201 and 202 (the first stage signal transmission path) shown in FIG. 2. The clock signal supplying circuit shown in FIG. 4 further respectively couples four signal transmission lines 211, 212, 213, and 214 of FIG. 2 with four signal transmission path groups 401, 402, 403, and 404, and low-frequency clock signals CK1, CK2, CK3, CK4, XCK1, XCK2, XCK3, and XCK4 are generated on signal transmission lines 411-418 by switches S41-S48 accordingly. In this embodiment, a control signal Ctrl_b is used for determined whether the two switches of each signal transmission path group are turned on, and further for turning on the two switches of each signal transmission path group at different time.

As the four signal transmission path groups 401, 402, 403, and 404 have the same structure, their operations are similar. In order to simplify the description, the signal transmission path group 401 is taken as an example and is described below.

The signal transmission path group 401 includes two signal transmission lines 411 and 412 (classified as third stage signal transmission path, see below). When the signal transmission path group 401 is determined by a control signal Ctrl_b (also named as second control signal, see below) whether to be conducted, the two signal transmission lines 411 and 412 are conducted at different time under the control of the control signal Ctrl_b. In other words, a control signal Ctrl_b (also named a second control signal, see below) is used for determining whether the signal transmission lines 411 and 412 are conducted, and further for turning on the two signal transmission lines 411 and 412 at different time.

Referring to FIG. 4 again, when the signal transmission line 211 transfers signals to the signal transmission path group 401, one of the two switches S41 and S42 is turned on, such that the two low-frequency clock signals CK1 and CK2 are generated on the two signal transmission lines 411 and 412 accordingly. The switch S41 (also named as third switch, see below) is electrically coupled between the two signal transmission lines 211 and 411. The switch S42 (also named as fourth switch, see below) is electrically coupled between the two signal transmission lines 211 and 412. The control signal Ctrl_b is used for determined whether the two switches S41 and S42 are turned on, and further for turning on the two switches S41 and S42 at different time.

According to the embodiment shown in FIG. 4, signals from the signal transmission line 212 are transmitted to the two switches S43 and S44, and the two low-frequency clock signals CK3 and CK4 are respectively generated on the two signal transmission lines 413 and 414. The two switches S43 and S44 are further determined by the control signal Ctrl_b to be turned on at different time. Signals from the signal transmission line 213 are transmitted to the two switches S45 and S46, and the two low-frequency clock signals XCK1 and XCK2 are respectively generated on the two signal transmission lines 415 and 416. The two switches S45 and S46 are further determined by the control signal Ctrl_b to be turned on at different time. Signals from the signal transmission line 214 are transmitted to the two switches S47 and S48, and the two low-frequency clock signals XCK3 and XCK4 are respectively generated on the two signal transmission lines 417 and 418. The two switches S47 and S48 are further determined by the control signal Ctrl_b to be turned on at different time.

Figure 5:
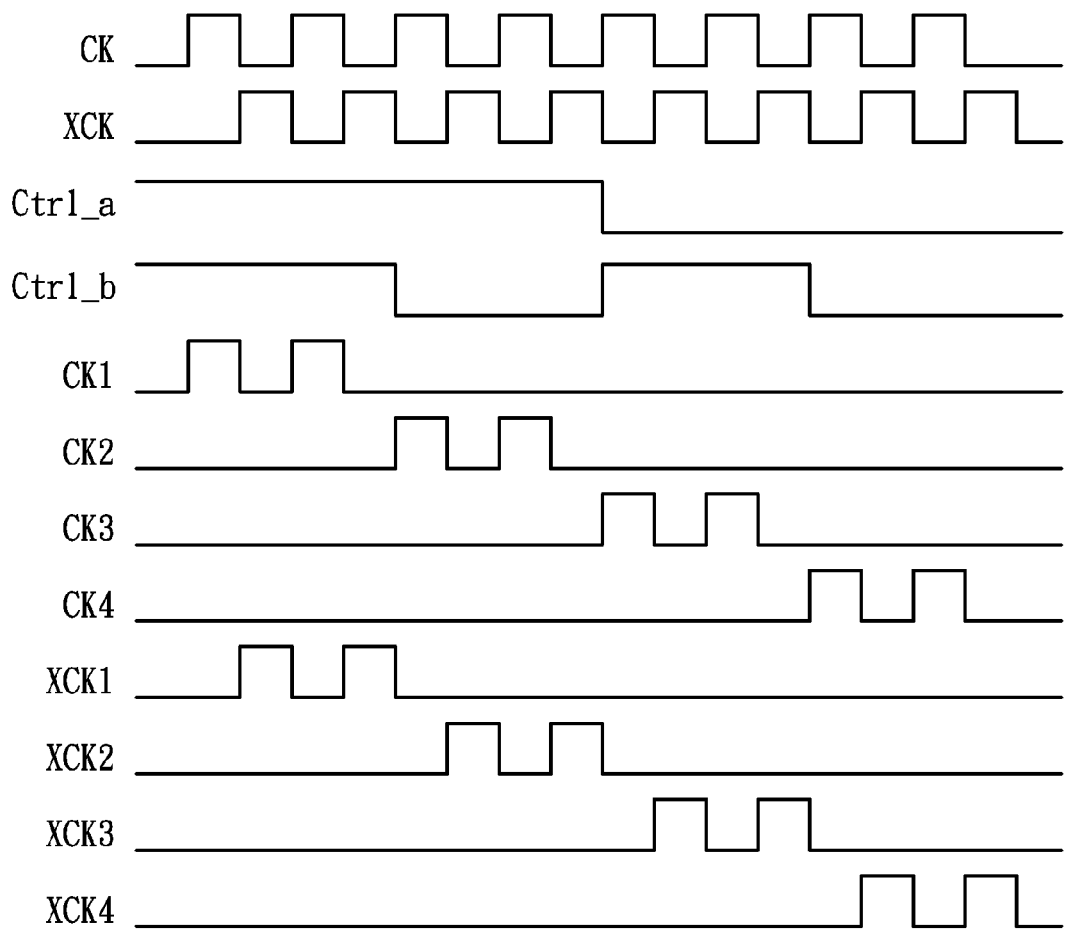
FIG. 5 is a timing diagram of a clock signal supplying method according to another embodiment.

Referring to FIG. 5, timing diagrams of the clock signal supplying method according to another embodiment are shown therein. Further referring to FIG. 4, when the control signal Ctrl_a of the first stage signal transmission path is a high level signal, and the control signal Ctrl_b of the second stage signal transmission path is also a high level signal, the high-frequency clock signal CK is converted to the low-frequency clock signal CK1 and is outputted by the signal transmission line 411 since the switch S41 is conducted (turned on). However, when the control signal Ctrl_a of the first stage signal transmission path is a high level signal, and the control signal Ctrl_b of the second stage signal transmission path is a low level signal, the high-frequency clock signal CK is converted to the low-frequency clock signal CK2 and is outputted by the signal transmission line 412 since the switch S42 is conducted (turned on). The other low-frequency clock signals CK3, CK4, and XCK1-XCK4 are generated by the similar way with the low-frequency clock signals CK1 and CK2. Therefore, according to present embodiment shown in FIG. 5, the clock signal supplying circuit 400 redistributes clock signals at different time by the two changeable control signals Ctrl_a and Ctrl_b, and the operation timing sequence is similar with that in FIG. 3B and is absent here.

By the way, one of the two switches in each signal transmission path group can apply either an N type transistor or a P type transistor, and the two switches in each signal transmission path group have reverse states at the same time. In other words, when one of the two switches in each signal transmission path group is turned on, the other one of that is turned off. In multi-stage signal transmission paths, as long as two switches in each signal transmission path group complete the same operation, they are no need to include a same circuit. That is to say, they are able to be designed by different circuit.

As described above, the clock signal supplying method used in the clock signal supplying circuit solves the problems existing in the prior art. Therefore, in the present disclosure, after the clock signal supplying circuit receives the clock signal, the clock signal is transmitted on the multi-stage signal transmission paths and is redistributed at different time to generate a redistributed clock signal. The redistributed clock signal is applied on different shift registers. Therefore, times for shifting the operation clock signal for the cascading shift register are decreased, and power consumption of the whole circuit is lower.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A clock signal supplying method for shift registers, comprising:
    receiving a clock signal; and
    transmitting the clock signal to two first stage signal transmission paths simultaneously, the first stage signal transmission paths determined by a first control signal whether to be conducted, and further conducted at different time,
    wherein signals from the different first stage signal transmission paths are applied on different shift registers.

2. The method according to claim 1, wherein when the first stage signal transmission paths are determined by the first control signal whether to be conducted, the first control signal comprises two contrary control signals.

3. The method according to claim 1, wherein each first stage signal transmission path is diverged into two second stage signal transmission paths, the second stage signal transmission paths are determined by a second control signals whether to be conducted, and are conducted at different time.

4. The method according to claim 3, wherein when the second stage signal transmission paths are determined by the second control signal whether to be conducted, the second control signal comprises two contrary control signals.

5. The method according to claim 3, wherein signals from the second stage signal transmission paths, which are diverged from the same first stage signal transmission path, are applied on different shift registers.

6. A clock signal supplying circuit for shift registers, comprising:
    a signal source, for receiving a clock signal;
    a first signal transmission line;
    a second signal transmission line;
    a first switch, electrically coupled between the signal source and the first signal transmission line; and
    a second switch, electrically coupled between the signal source and the second signal transmission line;
    wherein a first control signal is configured for controlling the first switch and the second switch whether to be turned on, and the first switch and the second switch are turned on at different time,
    wherein the first signal transmission line and the second signal transmission line are electrically coupled to a first shift register and a second shift register respectively.

7. The clock signal supplying circuit according to claim 6, further comprising:
    a third signal transmission line;
    a fourth signal transmission line;
    a third switch, electrically coupled between the first signal transmission line and the third signal transmission line; and
    a fourth switch, electrically coupled between the first signal transmission line and the fourth signal transmission line;
    wherein a second control signal is configured for controlling the third switch and the fourth switch whether to be turned on, and the third switch and the fourth switch are turned on different time.

8. The clock signal supplying circuit according to claim 7, wherein one of the third switch and the fourth switch is an N type transistor, and the other one of the third switch and the fourth switch is a P type transistor.

9. The clock signal supplying circuit according to claim 6, wherein one of the first switch and the second switch is an N type transistor, and the other one of the first switch and the second switch is a P type transistor.

* * * * *